United States Patent [19]
Capasso et al.

[11] Patent Number: 6,023,482
[45] Date of Patent: Feb. 8, 2000

[54] ARTICLE COMPRISING A STRAIN-COMPENSATED QC LASER

[75] Inventors: Federico Capasso, Westfield; Alfred Yi Cho, Summit; Sung-Nee George Chu, Murray Hill, all of N.J.; Jerome Faist, Neuchatel, Switzerland; Albert Lee Hutchinson, Piscataway; Deborah Lee Sivco, Warren, both of N.J.

[73] Assignee: Lucent Technologies Inc., Murray Hill, N.J.

[21] Appl. No.: 09/012,300

[22] Filed: Jan. 23, 1998

[51] Int. Cl.[7] .................................................. H01S 3/19
[52] U.S. Cl. ................................................................ 372/45
[58] Field of Search ........................................ 372/45, 46

[56] References Cited

U.S. PATENT DOCUMENTS

| | | | |
|---|---|---|---|
| 5,457,709 | 10/1995 | Capasso et al. | 372/45 |
| 5,509,025 | 4/1996 | Capasso et al. | 372/45 |
| 5,541,949 | 7/1996 | Bhat et al. | 372/45 |
| 5,570,386 | 10/1996 | Capasso et al. | 372/46 |
| 5,588,015 | 12/1996 | Yang | 372/45 |
| 5,745,516 | 4/1998 | Capasso et al. | 372/45 |
| 5,799,026 | 8/1998 | Meyer et al. | 372/45 |

FOREIGN PATENT DOCUMENTS

| | | | |
|---|---|---|---|
| 63-182550 | 7/1988 | Japan | G01N 21/39 |

OTHER PUBLICATIONS

"Band Lineups and Deformation Potentials in the Model–Solid Theory", by C. G. Van de Walle, *Physical Review B*, vol. 39, No. 3, Jan. 15, 1989, pp. 1871–1883.

"High Power Mid–Infrared (lambda~5 mu m) Quantum Cascade Lasers Operating Above Room Temperature", by J. Faist, *Applied Physics Letters*, vol. 68, No. 26, Jun. 24, 1996, pp. 3680–3682.

"Air Monitoring by Spectroscopic Techniques", by H. I. Schiff et al., John Wiley & Sons, Inc., Chapter 5, p. 239, 1994 (No Month).

Faist, J. et al., "High Power Mid–Infrared (Lambda 5 Mum) Quantum Cascade Lasers Operating Above Room Temperature", Applied Physics Letters, vol. 68, No. 26, Jun. 24, 1996, pp. 3680–3682.

Ido, T. et al., "Performance of Strained InGaAs/InAlAs Multiple–Quantum–Well Electroabsorption Modulators", Journal of Lightwave Technology, vol. 14, No. 10, Oct. 1, 1996, pp. 2324–2331.

Applied Physics Letters, vol. 70, No. 20, May 19, 1997, pp. 2670–2672.

Sorel, R.A. et al., "Progress Toward Silicon–Based Inter-subband Lasers", Journal of Vacuum Science and Technology, Part B, vol. b16, No. 3. May 1998, pp. 1525–1528.

Faist, J. et al., "Short Wavelength Quantum Cascade Laser Based on Strained Compensated InGaAs/AllnAs", Applied Physics Letters, vol. 72, No. 6, Feb. 9, 1998, pp. 680–683.

*Primary Examiner*—Rodney Bovernick
*Assistant Examiner*—Robert E. Wise
*Attorney, Agent, or Firm*—Eugen E. Pacher

[57] ABSTRACT

A quantum cascade (QC) laser has a multilayer core region comprising alternating layers of a first and a second semiconductor material, with lattice constants $a_1$ and $a_2$, respectively. The first material is selected such that $a_1 > a_0$, where $a_0$ is the lattice constant of the substrate (typically InP), and the second material is selected such that $a_2 > a_0$. The materials are also selected such that the conduction band discontinuity $\Delta E_c$ between the first and second materials is greater than 520 meV in absolute value. The multilayer core comprises a multiplicity of essentially identical multilayer repeat units. The layer thicknesses and materials of the repeat units are selected to substantially provide strain compensation over a repeat unit. QC lasers according to this invention preferably comprise a distributed feedback feature, (e.g., a Bragg grating) selected to ensure single mode laser emission, and can be designed for operation at a wavelength in the first atmospheric window, typically about 3–5 μm. Such lasers can advantageously be used for absorption spectroscopy, e.g., for emission monitoring.

12 Claims, 3 Drawing Sheets

ARTICLE COMPRISING A STRAIN-COMPENSATED QC LASER

GOVERNMENT CONTRACT

This invention was made with Government support under Contract No. DAA H0496C0026. The Government has certain rights in this invention.

FIELD OF THE INVENTION

This invention pertains to quantum cascade (QC) lasers, and to apparatus and systems that comprise a QC laser.

BACKGROUND

Recently a new class of semiconductor lasers, designated "quantum cascade" or "QC" lasers, was discovered. See, for instance, U.S. Pat. Nos. 5,457,709, 5,509,025 and 5,570,386, all incorporated herein by reference. See also U.S. patent applications Ser. No. 08/825,286 (filed Mar. 27, 1997) and U.S. Pat. No. 08/744,292 (filed Nov. 6, 1996), both incorporated herein by reference.

A "quantum cascade" or "QC" laser herein is a unipolar semiconductor laser having a multilayer structure that forms an optical waveguide, including a core region of relatively large effective refractive index between confinement regions of relatively small effective refractive index. The core region comprises a multiplicity of nominally identical repeat units, with each repeat unit comprising an active region and a carrier injector region. The active region has a layer structure selected to provide an upper and a lower carrier energy state, and such that a carrier transition from the upper to the lower energy state results in emission of a photon of wavelength $\lambda$. The carrier injector region has a layer structure selected to facilitate carrier transport from the lower energy state of the active region of a given repeat unit to the upper energy state of the active region of the adjacent (downstream) repeat unit. A carrier thus undergoes successive transitions from an upper to a lower energy state as the carrier moves through the layer structure, resulting in the creation of a multiplicity of photons of wavelength $\lambda$. The photon energy (and thus $\lambda$) depends on the structural and compositional details of the repeat units, and possibly also on the applied electric field and/or a distributed feedback element.

Although prior art QC lasers can be designed to emit at wavelengths in a wide spectral region, it would be desirable to have available a QC laser that can be designed for emission at wavelengths in the so-called first atmospheric window (approximately 3–5 $\mu$m). Such a laser would be important for a variety of applications, e.g., sensing of trace amounts of gases, for instance HCl.

Because QC lasers are based on carrier transitions between energy levels created by quantum confinement, attainable emission is limited on the short wavelength side by the size of the conduction band discontinuity between the two semiconductor materials of the active region. Prior art QC lasers generally are based on $In_{0.53}Ga_{0.47}As/In_{0.52}Al_{0.48}As$, which is lattice matched to InP and has a conduction band discontinuity $\Delta E_c$=520 meV. In this system maximum photon energies of about 250 meV (~0.48$\Delta E_c$) were realized at temperatures T$\geq$300 K.

To attain good coverage of the 3–5 $\mu$m atmospheric window, it would be desirable to have available a QC laser having heterojunctions with larger conduction band discontinuity than are available in prior art QC lasers. This application discloses such a QC laser.

SUMMARY OF THE INVENTION

The invention pertains generally to QC lasers, and to articles that comprise a QC laser.

More specifically, the QC laser comprises a multilayer semiconductor structure disposed on a semiconductor substrate having a lattice constant $a_0$. The structure forms an optical waveguide and comprises a lower confinement region, a core region disposed on the lower confinement region, and an upper confinement region disposed on the core region. Frequently the substrate forms the lower confinement region.

The core region comprises a multiplicity of nominally identical repeat units, with each repeat unit comprising an active region and a carrier injector region. The active region has a layer structure comprising alternating layers of a first and a second semiconductor material, respectively, and is selected to provide an upper and a lower carrier energy state, with a carrier transition from the upper to the lower carrier energy state resulting in emission of a photon of wavelength $\lambda$. The first semiconductor material has a lattice constant $a_1$, and the second semiconductor material has a lattice constant $a_2$.

The carrier injector region has a layer structure selected to facilitate carrier transport from the lower carrier energy state of the active region of a repeat unit to the upper carrier energy state of the active region of the adjacent (downstream) repeat unit.

The QC laser also comprises contacts selected to facilitate flowing an electric current through the multilayer semiconductor structure.

Significantly, the first and second semiconductor materials are selected to have lattice constants $a_1 > a_2$, typically $a_1 > a_0 > a_2$, where $a_0$ is the lattice constant of the substrate material (typically InP), and are furthermore selected such that a conduction band energy discontinuity $\Delta E_c$ between said first and second semiconductor compositions is greater than 520 meV in absolute value.

As will be recognized, provision of alternating layers with lattice constants respectively greater than $a_0$ and less than $a_0$ can result in strain compensation, facilitating growth of a QC laser having relatively large $\Delta E_c$, and thus capable of emitting radiation of relatively short wavelength $\lambda$.

Typically the layer thicknesses are selected such that, over a repeat unit, the strains substantially cancel. Furthermore, the layer thicknesses typically are selected to be less than the critical thickness for stress/strain-induced defect formation. This critical thickness can readily be determined for given first and second semiconductor compositions, and is typically greater than 5 nm.

By way of example, $In_xGa_{1-x}As$ has, for x>0.53, a lattice constant larger than that of InP, and $In_yAl_{1-y}As$ has, for y<0.52, a lattice constant smaller than that of InP.

Semiconductors of interest herein typically have cubic symmetry. Thus, "lattice constant" herein refers to the length of the edge of a cubic unit cell.

If $a_1 > a_0 > a_2$ then it is desirable that, for instance, $$|(\delta a_1/a_0)\Sigma t_1 + (\delta a_2/a_0)\Sigma t_2| < 0.2(\delta a_1/a_0)\Sigma t_1,$$

preferably $\leq 0.10$ $(\delta a_1/a_0)\Sigma t_1$. Still more preferably the right-hand side of the expression is approximately zero. In the above expressions, $\delta a_1 = a_1 - a_0$, $\delta a_2 = a_2 - a_0$, $\Sigma t_1$ is the sum of the first semiconductor material layer thicknesses in a given repeat unit, $\Sigma t_2$ is the corresponding sum of the second semiconductor material layer thicknesses, and the vertical bars signify absolute value. The above criteria are exemplary only, and other criteria can be devised to ensure the requisite strain compensation over a repeat unit.

DETAILED DESCRIPTION OF EXEMPLARY EMBODIMENTS

Figure 1:
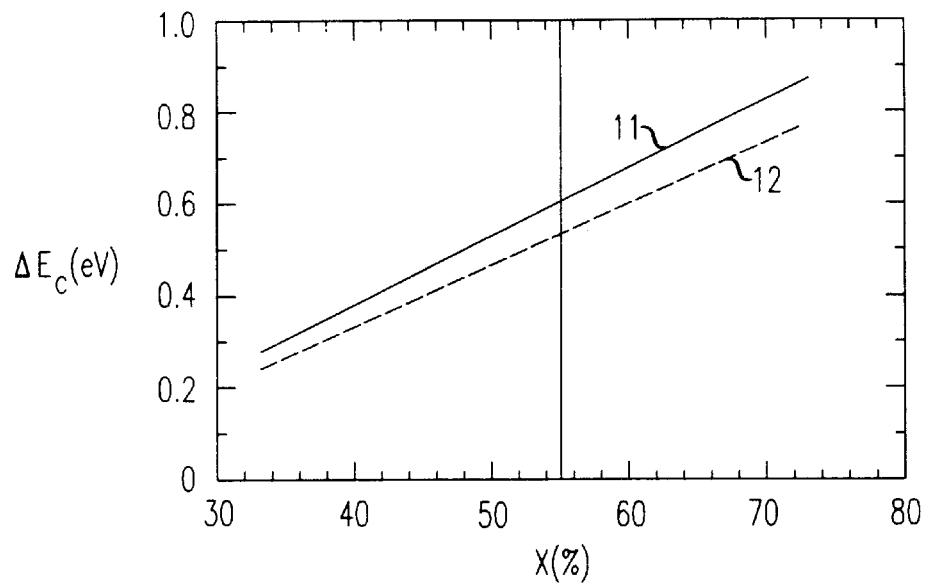
FIG. 1 shows computed curves of $\Delta E_c$ vs. indium content of $In_xGa_{1-x}As$ for a strain-compensated InGaAs/InAlAs bilayer on InP.

In FIG. 1, the solid curve 11 shows the conduction band discontinuity $\Delta E_c$ as a function of x, calculated using the model-solid theory (see C. G. Van de Walle, *Phys. Review B*39, p. 1871 (1988)), for a strain compensated bilayer of $In_xGa_{1-x}As/In_yAl_{1-y}As$ grown on an InP substrate. The InGaAs layer thickness is assumed to be 40% of the total bilayer thickness. The dash line 12 shows the calculated value of the discontinuity, scaled by the known value of the discontinuity at the lattice matched composition (corresponding to x=0.53). As can be seen from FIG. 1, $\Delta E_c$ increases with increasing x in $In_xGa_{1-x}As/In_yAl_{1-y}As$. For instance, $\Delta E_c=0.74$ eV for a bilayer of composition $In_{0.7}Ga_{0.3}As/In_{0.4}Al_{0.6}As$.

Figure 2:
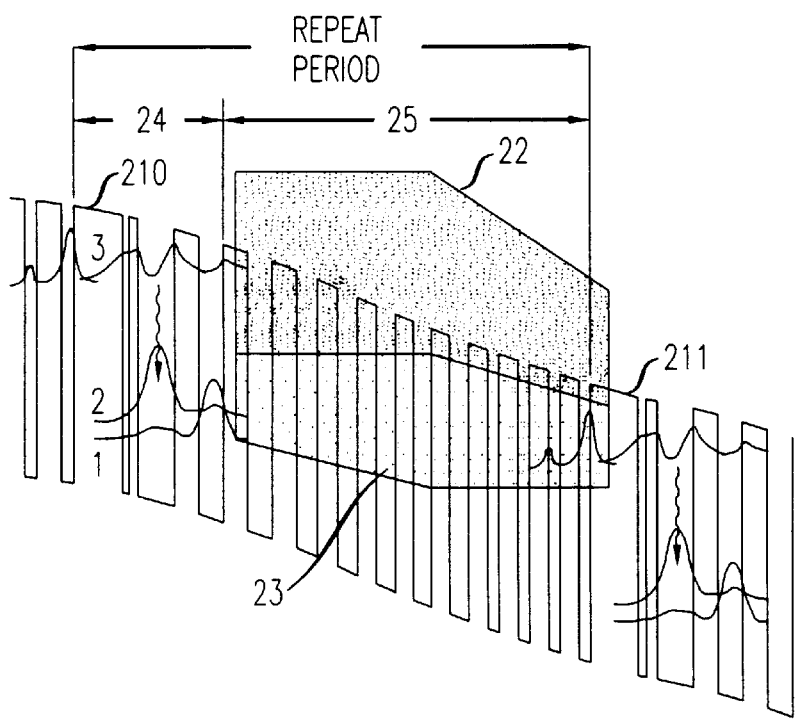
FIG. 2 schematically shows relevant aspects of one repeat unit of the core region, including the conduction band edge, energy levels, and minigap and funnel injector.

FIG. 2 shows the conduction band edge and associated features of a repeat unit of a QC laser according to the invention, under an applied field of $9.6 \times 10^4$ V/cm. For the sake of concreteness, a repeat unit is assumed to extend from injection barrier 210 to injection barrier 211. The figure also shows the moduli squared of the relevant wavefunctions. The wavy line from energy level 3 to 2 indicates the transition responsible for laser action. The figure also indicates active region 24 and carrier injector region 25, the latter having a chirped superlattice that provides "minigap" 22 and "funnel injector" 23 as known to those skilled in the art. See, for instance, J. Faist et al., *Applied Physics Letters*, Vol. 68(26), p. 3680, June 1996, incorporated herein by reference. The minigap suppresses escape of carriers from upper energy level 3 into the continuum, and the funnel injector facilitates carrier transport from energy level 1 to energy level 3 of the downstream repeat unit.

The following layer structure of an exemplary QC laser according to the invention was deposited by molecular beam epitaxy (MBE).

| | | | |
|---|---|---|---|
| UPPER CONFINEMENT | $In_{0.53}Ga_{0.47}As$ | $n = 1 \times 10^{20}$ $cm^{-3}$ | 10 nm |
| | $In_{0.52}Al_{0.48}As$ | $7 \times 10^{18}$ | 1000 |
| REGION | $In_{0.52}Al_{0.48}As$ | $3 \times 10^{17}$ | 1300 |
| CORE | $In_{0.53}Ga_{0.47}As$ | $1 \times 10^{17}$ | 200 |
| | 5 × $In_{0.7}Ga_{0.3}As/In_{0.4}Al_{0.6}As$ SL | | |
| | 16 × active region + injector region | | 880 |
| | 6 × $In_{0.7}Ga_{0.3}As/In_{0.4}Al_{0.6}As$ SL | | |
| | $In_{0.53}Ga_{0.47}As$ | $1 \times 10^{17}$ | 300 |
| LOWER CONFINEMENT REGION | InP substrate | $1 \times 10^{18}$ | |

"SL" stands for "superlattice". All thicknesses are in nm, and all dopant levels are in carriers/cm$^3$. Conventional features, e.g., graded transition layers or digital gratings, are not shown in the above layer sequence.

The superlattices consist of 2 nm thick $In_{0.7}Ga_{0.3}$As well layers between 3 nm thick $In_{0.4}Al_{0.6}$As barrier layers. The layer sequence of one repeat unit of the active region/injector region, in nanometers, starting from the injection barrier 210 and proceeding with alternating well and barrier layers, is given below. The barrier layers are of composition $In_{0.4}Al_{0.6}$As, and the well layers are of composition $In_{0.7}Ga_{0.3}$As. The starred layers are doped with Si to 2.5× $10^{17}$ cm$^{-3}$. The remaining layers are not intentionally doped.

| Barrier | Well |
|---|---|
| 4.5 | 0.5 |
| 1.2 | 3.5 |
| 2.3 | 3.0 |
| 2.8 | 2.0 |
| 1.8 | 1.8 |
| 1.8 | 1.9* |
| 1.8 | 1.5* |
| 2.0 | 1.5* |
| 2.3 | 1.4* |
| 2.5 | 1.3* |
| 3.0 | 1.3 |
| 3.4 | 1.2 |
| 3.6 | 1.1 |

The above described layer structure meets the requirement $a_1 > a_0 > a_2$, with the first and second semiconductor materials being $In_{0.7}Ga_{0.3}$As and $In_{0.4}Al_{0.6}$As, respectively. Indeed, the structure is substantially strain compensated, with each repeat unit readily meeting the requirement $$|(\delta a_1/a_0)\Sigma t_1 + (\delta a_2/a_0)\Sigma t_2| \leq 0.1(\delta a_1/a_0)\Sigma t_1,$$

In FIG. 2, the energy states and electron wavefunctions were computed by solving Schroedinger's equation in a one band model in known manner, with the non-parabolicity introduced through an energy-dependent effective mass. The value of the non-parabolicity coefficient y was determined to be $1.53 \times 10^{-18}$ for $In_{0.7}Ga_{0.3}$As, and the values of the effective masses were determined to be 0.035 $m_0$ for $In_{0.7}Ga_{0.3}$As and 0.0896 $m_0$ for $In_{0.4}Al_{0.6}$As, respectively, where $m_0$ is the free electron mass.

The laser transition typically is from level 3 to level 2, with the calculated transition energy $E_{23}$ being 392 meV, corresponding to $\lambda=3.16$ μm. The active region was engineered such that at the threshold field (96 kV/cm) the ground states of the 3.5 nm and 3.0 nm thick quantum wells in the active region have anti-crossed, thereby achieving an energy separation that is resonant with the optical phonon energy (~34 meV), resulting in a short (~0.4 ps) lifetime of the n=2 state. The electron scattering time from level 3 to the lower levels involves optical phonon emission associated with a large momentum transfer, and consequently is relatively long, about 1.7 ps.

Figure 3:
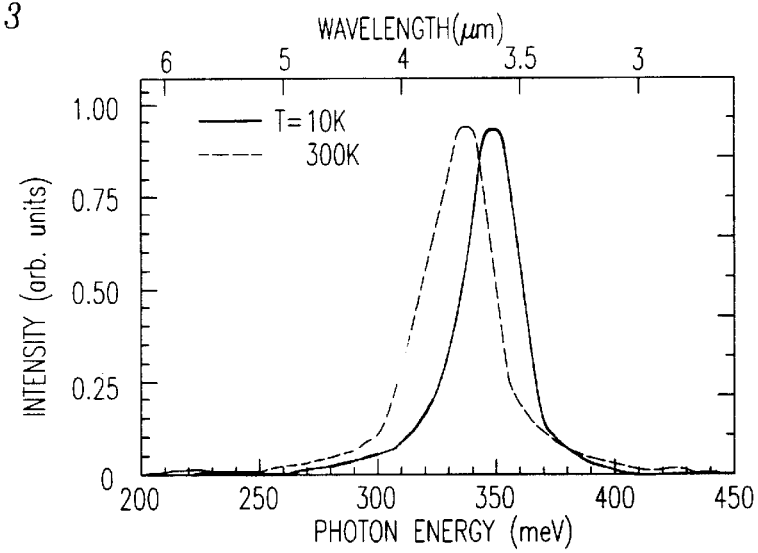
FIG. 3 shows exemplary data on electroluminescence vs. wavelength and photon energy.

FIG. 3 shows electroluminescence data for 125 $\mu$m diameter mesa devices of the above described layer structure. The data were taken at 10K and 300K, and are indicative of excellent crystalline and interface quality of the layer material. The observed luminescence peak is well within the wavelength band of the first atmospheric window.

A wafer with MBE-produced layer structure as described above was processed into mesa etched ridge waveguides of width 10–14 $\mu$m by conventional wet chemical etching and $Si_3N_4$ (350 nm) insulation. Non-alloyed Ti/Au ohmic contacts (0.4 $\mu$m) were formed on the top layer and the InP substrate. The wafer was then cleaved into 3 mm wide bars and the facets left uncoated. The bars were then mounted, with layer structure up, on the temperature-controlled (10–320K) cold head of a He flow cryostat. The lasers were then driven by 50 ns current pulses with 4.5 kHz repetition rate.

Figure 4:
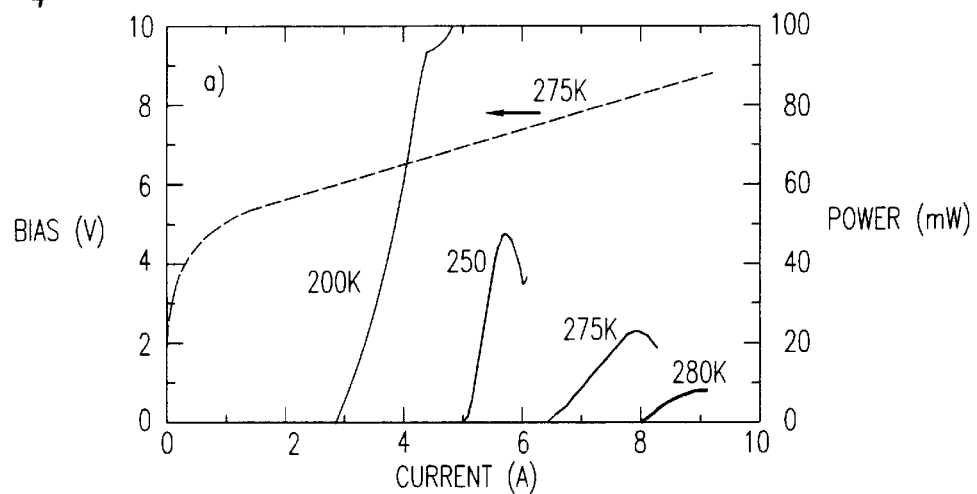
FIG. 4 shows exemplary data on optical power vs. drive current, as well as a representative current-voltage characteristic, in pulsed current operation.

FIG. 4 shows optical power vs. drive current in pulsed current operation, from a single facet of an exemplary laser. The emission wavelength of the laser was 3.49 $\mu$m at 10K and 3.58 $\mu$m at 270K. The dashed curve in FIG. 4 is a representative current-voltage characteristic at 275K. The threshold voltage for lasing typically was between 6.5 V (at 10K) and 8.5 V (at 275K).

Figure 5:
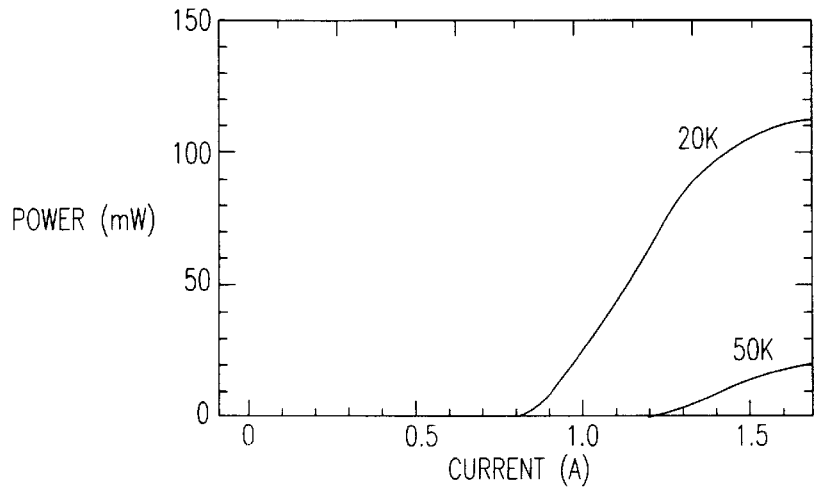
FIG. 5 shows optical power vs. current, in CW operation.
Figure 6:
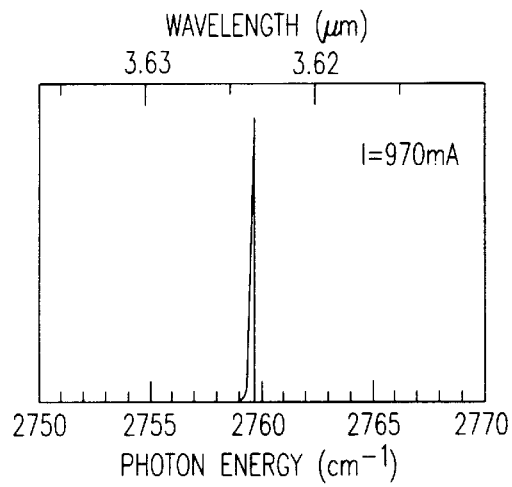
FIG. 6 shows optical power vs. wavelength in CW operation.

FIG. 5 shows optical power vs. current, for an exemplary laser, in CW operation and FIG. 6 shows optical power vs. wavelength, also in CW operation. The latter figure demonstrates single mode operation above threshold.

A laser according to the invention can be advantageously used as radiation source in, for instance, apparatus for absorption spectroscopy in the first atmospheric window. See, for instance, H. I. Schiff et al., "Air Monitoring by Spectroscopic Techniques", M. W. Sigrist, editor, Wiley Interscience, 1994.

Lasers according to the invention have properties that will, we believe, make them useful in many applications, including applications that currently utilize mid-IR lead salt lasers or near-IR semiconductor lasers that target overtone resonances of a gaseous measurement species. By way of example, lasers according to the invention can be advantageously used for trace gas analysis, e.g., for environment applications, automotive emission sensors, combustion diagnostics, industrial process control, medical applications or collision avoidance radar for aircraft or automobiles.

In general lasers according to the invention can advantageously be used in point sensing apparatus as well as in remote sensing apparatus, and can be used in CW as well as pulse mode.

Figure 7:
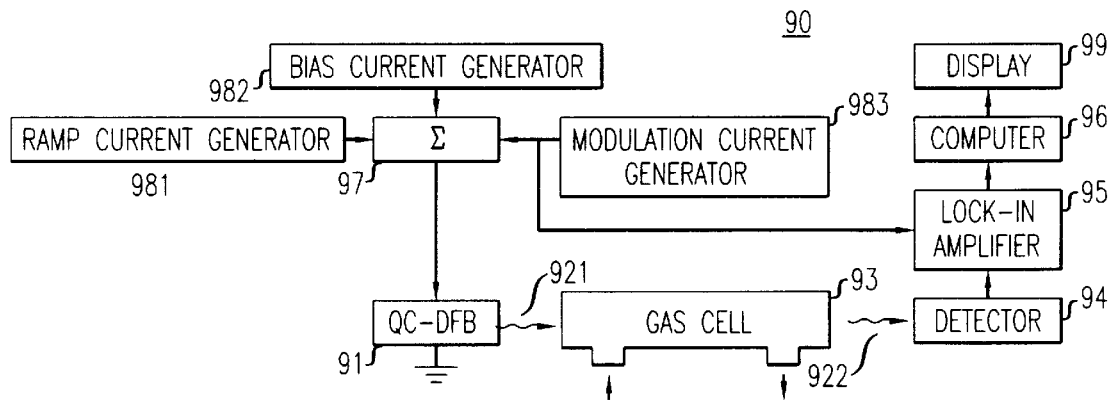
FIGS. 7 and 8 schematically depict exemplary apparatus comprising a laser according to this invention, namely, apparatus for absorption spectroscopy.

FIG. 7 schematically depicts exemplary point sensing apparatus 90, wherein numeral 91 refers to a laser according to the invention. Typically the laser is mounted on a temperature-controlled stage (not shown) for coarse wavelength tuning. Mid-IR radiation 921 from the laser passes through conventional gas cell 93 (optionally a multi-pass cell), with exited radiation 922 impinging on conventional detector 94. The electrical output of the detector is supplied to lock-in amplifier 95 (together with an appropriate modulation signal, e.g., a 1.2 kHz sine wave from modulation signal generator 983), and the lock-in amplifier output is supplied to computer 96 for data analysis and formatting. The data is then displayed and/or stored in any suitable manner. The laser is pumped with an appropriate electrical current. For instance, a low frequency current ramp (e.g., 250 ms period) from ramp current generator 981, short bias pulses (e.g., 5 ns pulse width, 2 $\mu$s period) from bias current generator 982, and a modulation signal from modulation current generator 983 are supplied to combiner 97, and the resultant current ramp with superimposed current pulses and sine wave is applied to the laser. The current ramp serves to sweep the laser temperature over a predetermined range, and the pulses cause the emission of short laser pulses. The pulse wavelength is slowly swept over a range of wavelengths, and absorption as a function of wavelength is determined. Thus, the presence in the cell of a gas that has an absorption line in the range of wavelengths is readily detected, and the gas can be identified. As those skilled in the art will recognize, some conventional features are not shown in FIG. 7. For instance, the measurement set-up will typically be under computer control, requiring further inputs to, and outputs from the computer.

Figure 8:
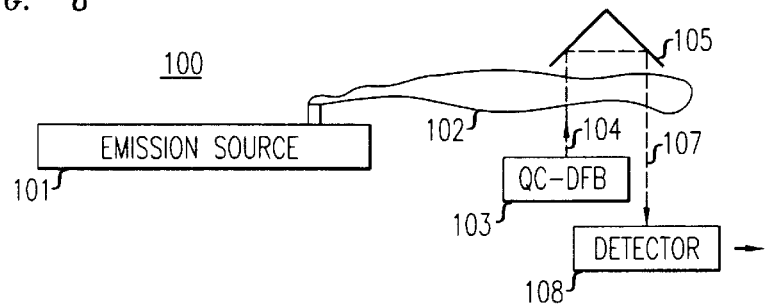

FIG. 8 schematically depicts an exemplary remote-sensing system 100, wherein emission source 101 (e.g., a factory) emits gaseous emission cloud 102. Laser 103 emits mid-IR radiation 104 which propagates through the emission cloud, and is reflected (e.g., by means of a corner reflector 105). Reflected radiation 107 then is detected by means of detector 108. The laser can be pumped in any appropriate manner, e.g., as described in conjunction with FIG. 7, and the detector output can be utilized in any appropriate manner, e.g., also as described above. A mirror or other appropriate reflector can be used instead of corner reflector 105. The reflector can be on an aircraft or any elevated feature, including the smoke stack that is being monitored. In general, any arrangement that results in a line-of-sight disposition of laser and detector is contemplated.

The laser will generally be mounted in an appropriate housing for protection and control. The package will typically comprise cooling means (e.g., water cooling, thermo-electric cooling), temperature sensor means (e.g., a thermocouple) for use in a feedback loop for temperature control, and means for applying the pump current to the laser. The laser is attached in conventional fashion to the cooling means. Optionally the housing may also contain detector means for controlling laser output power. The housing will typically have a window that is transparent for the laser radiation, and will typically be evacuated or filled with inert gas. See also U.S. patent application Ser. No. 08/852,646, incorporated herein by reference.

Figure 9:
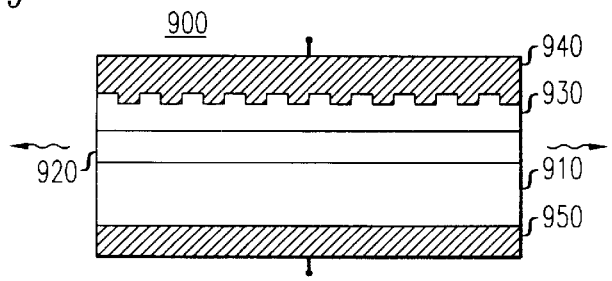
FIG. 9 schematically shows a DFB QC laser according to the invention.

As will be readily understood by those skilled in the art, QC lasers according to this invention that are to be used for absorption spectroscopy or similar applications advantageously will be provided with feedback means to ensure single mode operation. Such feedback means typically are a Bragg grating, as described in detail in U.S. patent application Ser. No. 08/852,646. FIG. 9 schematically shows an exemplary QC laser 900 according to the invention with distributed feedback (DFB) feature. Numerals 910, 920 and 930 refer to the lower confinement region, the QC active region with a multiplicity of repeat units, and the upper confinement region, with a grating on the top surface. Numerals 940 and 950 refer to metallization layers. The wavy arrows indicate output radiation.

The invention claimed is:
1. An article comprising a quantum cascade laser comprising a multilayer semiconductor structure disposed on a semiconductor substrate having lattice constant $a_0$, wherein
   a) said multilayer semiconductor structure forms an optical waveguide that comprises a lower confinement region, a core region disposed on the lower confinement region, and an upper confinement region disposed on the core region;

b) the core region comprises a multiplicity of nominally identical repeat units, with each repeat unit comprising an active region and a carrier injector region, with the active region having a layer structure comprising alternating layers of a first semiconductor material and a second semiconductor material, and selected to provide an upper and a lower carrier energy state, with a carrier transition from the upper to the lower carrier energy state resulting in emission of a photon of wavelength $\lambda$, and with the carrier injector region having a layer structure selected to facilitate carrier transport from the lower carrier energy state of the active region to the upper carrier energy state of the active region of an adjacent downstream repeat unit; and c) the quantum cascade laser comprises contacts selected to facilitate flowing an electric current through the multilayer semiconductor structure;

CHARACTERIZED IN THAT d) the first semiconductor material is selected to have a lattice constant $a_1 > a_0$, and the second semiconductor material is selected to have a lattice constant $a_2 < a_0$, and furthermore is selected such that a conduction band energy discontinuity $\Delta E_c$ between said first and second semiconductor material is greater than 520 meV in absolute value.

2. An article according to claim 1, wherein said first and second semiconductor materials and repeat unit layer thicknesses are selected such that $|(\delta a_1/a_0)\Sigma t_1 + (\delta a_2/a_0)\Sigma t_2|$ is less than 0.2 $(\delta a_1/a_0)\Sigma t_1$, where $\delta a_1 = a_1 - a_0$, $\delta a_2 = a_2 - a_0$, $\Sigma t_1$ and $\Sigma t_2$ are the sums of the respective thicknesses of the first and second semiconductor material layers of a given repeat unit, and the vertical bars signify the absolute value.

3. An article according to claim 2, wherein the first and second semiconductor materials and layer thicknesses are selected such that $|(\delta a_1/a_0)\Sigma t_1 + (\delta a_2/a_0)\Sigma t_2|$ is less than or equal to 0.1 $(\delta a_1/a_0)\Sigma t_1$.

4. An article according to claim 1, wherein the quantum cascade laser further comprises a distributed feedback feature.

5. An article according to claim 4, wherein the distributed feedback feature is a Bragg grating disposed in a confinement region.

6. Article according to claim 1, wherein the article is a measurement system for measuring absorption of infrared radiation by a measurement species, wherein the measurement system comprises a source of single mode infrared laser radiation comprising the quantum cascade laser of claim 1; and further comprising a detector for detecting the single mode infrared laser radiation after passage thereof through a quantity of said measurement species.

7. Measurement system according to claim 6, wherein said measurement species is a gas disposed in a measurement cell.

8. Measurement system according to claim 6, wherein said measurement species is an unconfined gas.

9. Article according to claim 1, further comprising a current source connected to said electrical contacts, said current source providing a laser-heating current to the laser such that the wavelength of the single mode laser radiation varies in accordance with the laser-heating current.

10. Article according to claim 9, wherein said laser-heating current comprises a current ramp.

11. Article according to claim 1, wherein said single mode laser radiation has wavelength in the range referred to as the first atmospheric window.

12. Article according to claim 1, wherein said single mode laser radiation has wavelength in the approximate range 3–5 $\mu$m.

* * * * *